United States Patent
Chan et al.

(10) Patent No.: US 6,251,713 B1
(45) Date of Patent: *Jun. 26, 2001

(54) METHOD OF MAKING AN SRAM STORAGE CELL WITH N CHANNEL THIN FILM TRANSISTOR LOAD DEVICES

(75) Inventors: Tsiu Chiu Chan; Loi N. Nguyen, both of Carrollton, TX (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/979,580

(22) Filed: Nov. 26, 1997

Related U.S. Application Data

(62) Division of application No. 08/774,911, filed on Dec. 27, 1996, now Pat. No. 5,870,330.

(51) Int. Cl.[7] ..................................................... H01L 21/00
(52) U.S. Cl. ........................ 438/152; 438/153; 438/154; 438/155; 438/156; 438/149
(58) Field of Search ................................. 438/149, 151, 438/152, 153, 154, 155, 156

(56) References Cited

U.S. PATENT DOCUMENTS

| | | | |
|---|---|---|---|
| 5,187,114 | * | 2/1993 | Chan et al. .............................. 437/52 |
| 5,364,810 | * | 11/1994 | Kosa et al. .............................. 437/38 |
| 5,460,995 | * | 10/1995 | Klyono et al. .......................... 437/52 |
| 5,471,070 | | 11/1995 | Shimada et al. ........................ 257/57 |
| 5,514,617 | * | 5/1996 | Liu .......................................... 437/60 |
| 5,599,729 | * | 2/1997 | Park ........................................ 437/52 |
| 5,731,232 | * | 3/1998 | Wuu et al. ............................. 438/153 |

OTHER PUBLICATIONS

McKenny, Vernon, "Depletion–Mode Devices Hike Speed of MOS Random Access Memory", *Electronics*, Feb. 15, 1971 pp. 80–85.

Capece, Raymond P., "The Race Heats Up In Fast Static RAMs", *Electronics*, Apr. 26, 1979, pp. 125–135.

* cited by examiner

*Primary Examiner*—Matthew Smith
*Assistant Examiner*—Belur V. Keshavan
(74) *Attorney, Agent, or Firm*—Theodore E. Galanthay; Lisa K. Jorgenson; Andre Szuwalski

(57) ABSTRACT

An SRAM cell includes a pair of N channel transistors acting as inverting circuits, a pair of N channel transistors which perform the control function for the cell, and a pair of N channel thin film transistors in depletion mode with gate and source shorted to provide load devices for the N channel inverter transistors of the SRAM cell.

15 Claims, 4 Drawing Sheets

METHOD OF MAKING AN SRAM STORAGE CELL WITH N CHANNEL THIN FILM TRANSISTOR LOAD DEVICES

This application is a division of application Ser. No. 08/774,911, filed Dec. 27, 1996, now U.S. Pat. No. 5,870,330.

BACKGROUND OF THE INVENTION

1. Field of the Invention

The present invention relates to semiconductor integrated circuit structures and methods of making such structures and, more particularly, to method of making and structure of an SRAM cell having N channel depletion TFT load devices.

2. Prior Art

CMOS static RAM access memories (SRAM) are used in the semiconductor and computer industries as a result of the combination of speed, low power, and no requirement for refresh. Information can be written into and read out of an SRAM cell faster than with a DRAM cell, because the transistors of the SRAM cell can be switched faster than capacitors can be charged and drained. However, a disadvantage of prior art SRAM cells is that such cells have required a larger footprint to achieve greater speed and stability than DRAM cells.

An SRAM cell can be formed using cross-coupled CMOS inverters having two N channel transistors and two P channel transistors. Typically, the cell is accessed by two N channel control gates for a standard SRAM cell and four control gates for two port memory devices.

There have been many attempts to improve SRAM cells by replacing the P channel transistors with other devices. For example, in same cases, the P channel transistors are replaced with poly silicon resistance back-to-back diodes as resistive load devices. However, the resistance of the back-to-back diode increases significantly at lower voltages and lower temperatures. For example, resistance might be ten times higher at 0° C. as compared to 80° C.

Further, a major single bit failure which has occurred during functional testing of SRAM cells is data retention at low voltage at low temperature. These single bit failures occur when the amount of leakage current at the storage node exceeds the amount of current that can be supplied by the back-to-back diode resistance during low voltage and cold temperature.

One attempt to solve the problem has been to reduce the overall resistance value of the back-to-back diode. However, when the load resistance of a cell is decreased, the amount of standby current is significantly increased, thus increasing power dissipation in the cell.

Another prior art approach has been to employ poly silicon resistance devices as load devices. Although the voltage dependency is lower than that of the back-to-back resistance diode approach, the temperature dependency still prevails with higher resistance values at low to temperature as compared to high temperature resistance.

The P channel MOSFET device provides a low off current and a high on current to sustain leakage of the storage node. However, if the pulldown transistors exhibit high leakage, the Vcc must be electrically disconnected to reduce the standby current. Additionally, for the P channel device, the cell area is much larger than for the other devices described above. Such a cell and the method of making same are taught in U.S. Pat. No. 5,187,114.

Another prior art attempt to solve some of the problems of load devices in SRAM cells has been the use of P channel thin film transistors as the load devices. However, the P channel TFTs are difficult to fabricate with low off current and high on current and further requires the alignment offset of the Drain implant which has a large impact on controlling the on and off current. Further, the P channel TFT has a cell area which is at least 50 percent larger than the back-to-back diode load implementation.

There is a need for an SRAM cell which is relatively immune from voltage variation, which does not require a source/drain offset, which does not require the Vcc line to be disconnected where the pulldown transistors exhibit high leakage current, and which conserves power and energy by controlling current from low Vcc to high Vcc.

SUMMARY OF THE INVENTION

Accordingly, an SRAM cell includes a pair of N channel transistors acting as inverting circuits, a pair of N channel transistors which perform the control function for the cell, and a pair of N channel thin film transistors in depletion mode with gate and source shorted to provide load devices for the N channel inverter transistors of the SRAM cell.

A method for constructing an SRAM cell in accordance with the present invention includes the following steps:

Formation of active and field isolation layer;
Deposition of gate electrode definition and formation of passgate and pulldown transistor;
Deposition of TEOS;
Pattern and etch shared contact 1 (SC1);
Deposition of poly silicon layer 2;
Local interconnect and gate electrode for the N channel TFT;
Implanting phosphorous to desired sheet resistance (rho);
Annealing for predetermined time at predetermined temperature;
Patterning and etching poly silicon layer 2;
Deposition of TEOS at a predetermined thickness to form gate dielectric for the N channel TFT;
Annealing at a predetermined temperature for a predetermined time;
Pattern and etch layer shared contact 2 (SC2);
Deposition of poly silicon layer 3;
Patterning and etching poly silicon layer 3;
Blanketing N channel TFT implant;
Patterning TFT;
Implanting N+ TFT source/drain;
Deposition of dielectric; and
Contact and metal interconnection.

It is an advantage of the present invention that an SRAM cell in accordance with the present invention has virtually no dependency on supply voltage, does not require supply voltage to be electrically disconnected where the pulldown transistors have high leakage current, and where the load devices act as constant current sources within the SRAM cell.

DETAILED DESCRIPTION OF A PREFERRED EMBODIMENT OF THE INVENTION

The process steps and structures described herein do not form a complete process flow for manufacturing integrated circuits. The present invention can be practiced in conjunction with integrated circuit fabrication techniques currently used in the prior art, and only so much of the commonly practiced process steps are included as are necessary for an understanding of the present invention. The figures representing cross-sections of portions of an integrated circuit during fabrication are not drawn to scale but instead are drawn so as to illustrate the important features of the invention.

Figure 1:
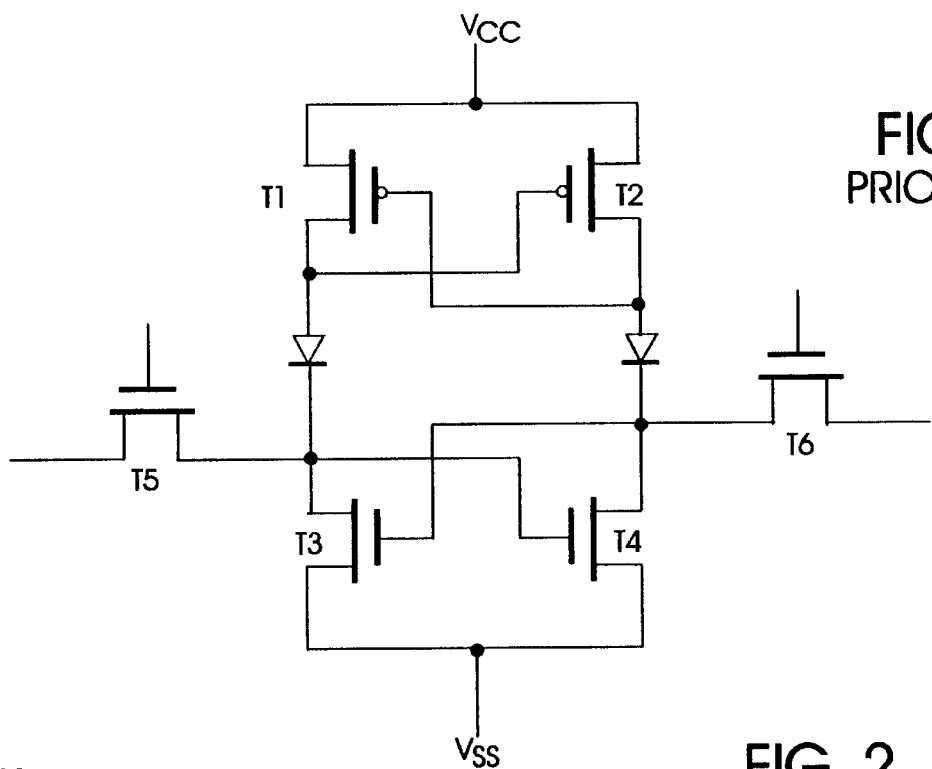
FIG. 1 is a circuit diagram of a prior art SRAM cell employing P channel transistors as load devices.

Referring now to FIG. 1, a prior art SRAM cell is shown where P channel TFT transistors are used as load devices. Transistors T1 and T2 are P channel transistors which serve as load devices for the pulldown transistors T3 and T4, respectively, in the cell. Transistors T5 and T6 are the control transistors of the SRAM cell. The prior art circuit of FIG. 1 is subject to the disadvantages described above in the background of the invention.

Figure 2:
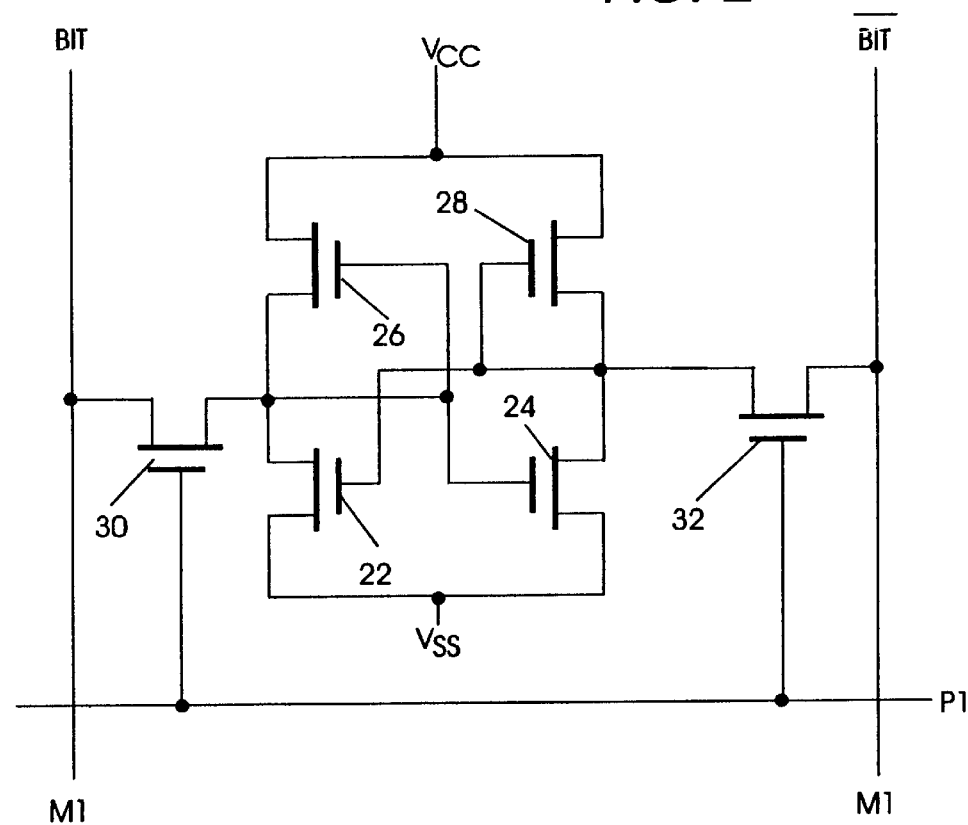
FIG. 2 is a circuit diagram of an SRAM cell in accordance with the present invention.

Referring now to FIG. 2, an SRAM cell 20 embodying the present invention will be described. Cell 20 includes cross-coupled inverters which consist of pulldown transistors 22 and 24 having respective load devices 26 and 28 where pulldown transistors 22 and 24 are N channel devices, and load transistors 26 and 28 are depleted N channel thin film transistors having gate and source connected together. Transistors 30 and 32 are the control transistors which connect the cell to bit and word lines in a memory array 70 (see FIG. 6).

Figure 3:
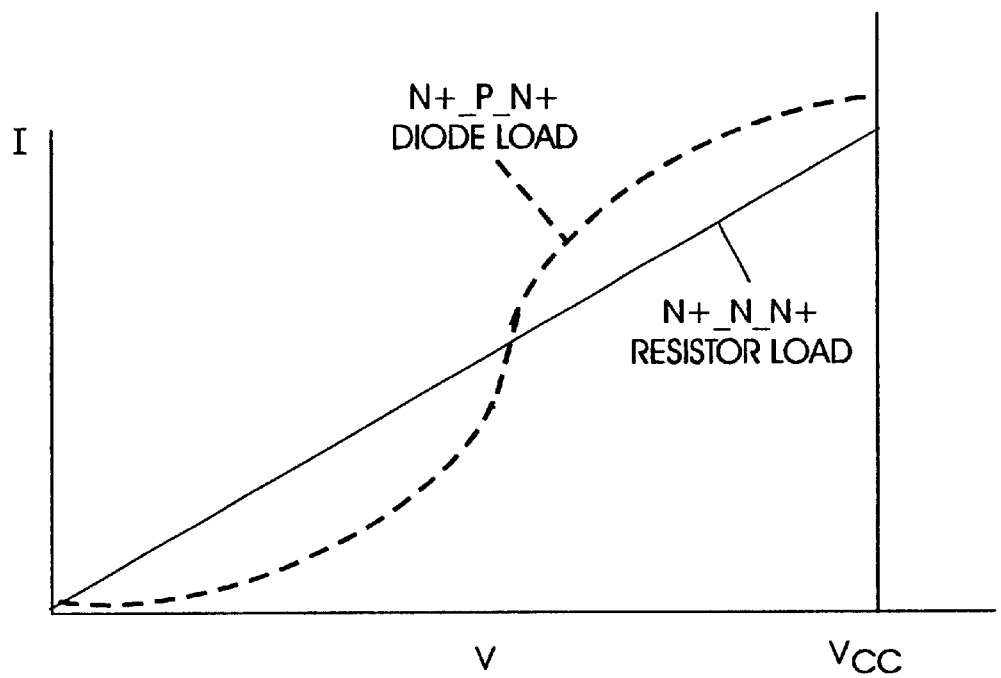
FIG. 3 is a graphical representation of current against voltage characteristics for prior art SRAM cells.
Figure 4:
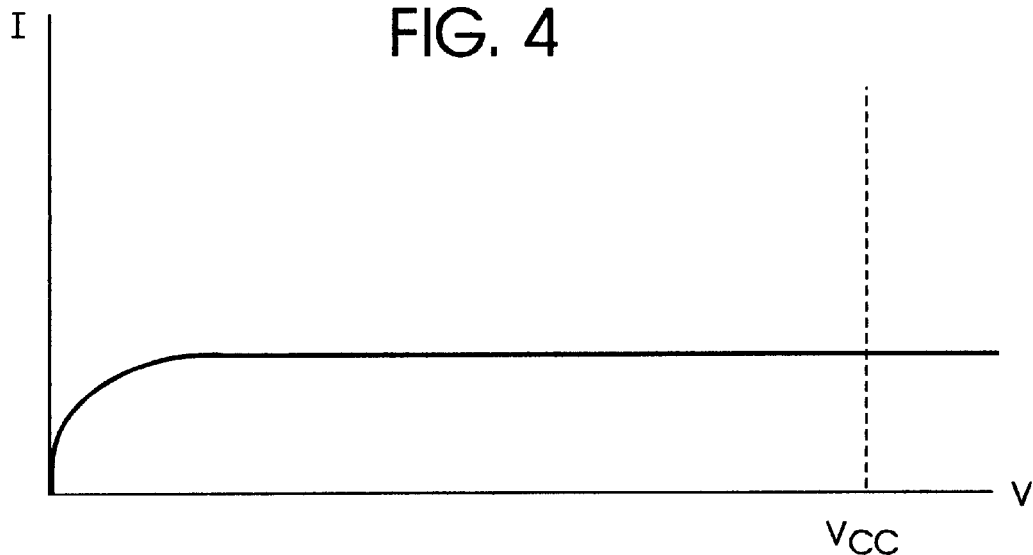
FIG. 4 is a graphical representation of the current vs. voltage characteristics of an SRAM cell in accordance with the present invention.

Referring now to FIGS. 3 and 4, the current/voltage characteristics of prior art SRAM cells and an SRAM cell in accordance with the present invention will be discussed. The solid straight line shown in the graphical representation of FIG. 3 represents a resistive load such as might be formed by back-to-back diodes. Note that the current voltage characteristics of the load are linearly variable as Vcc changes.

Similarly, a diode load is shown in the dotted line having a current vs. voltage characteristic which is generally S-shaped. Note that the current is low as voltage increases from 0 to a point where the cell becomes unstable and then current increases wore rapidly as the voltage approaches Vcc.

In contrast, FIG. 4 shows the current vs. voltage characteristics of an SRAM cell in accordance with the present invention. After an initial rise in current as voltage rises from 0 to some relatively low value, the amount of current remains relatively constant as Vcc varies from the low voltage to maximum Vcc. This provides a much more stable cell and eliminates voltage dependency in the cell. It also provides the cell with a much smaller current drain than the prior art cells.

Figure 5:
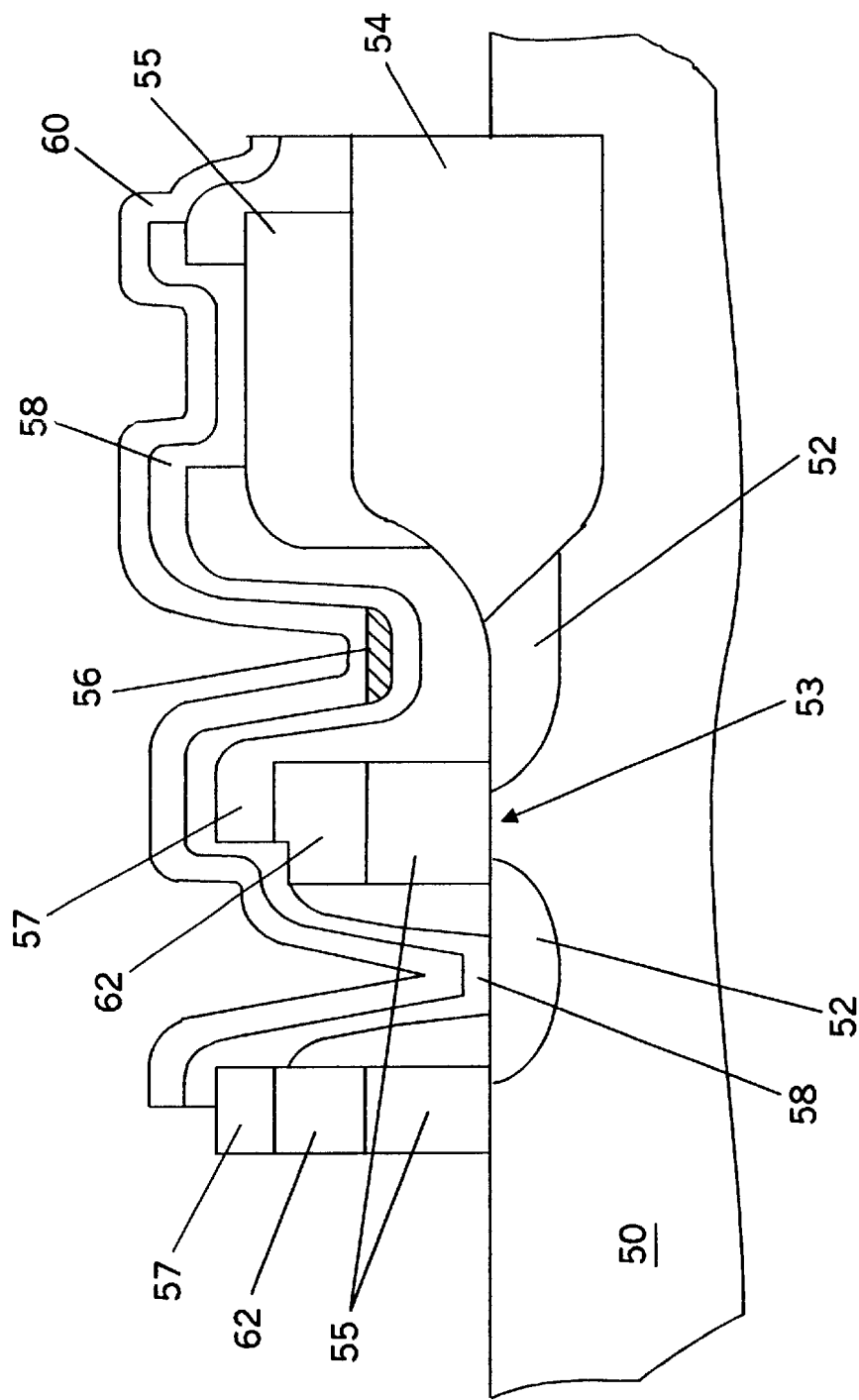
FIG. 5 is a cross-section view of an SRAM cell in accordance with the present invention.

Referring now to FIG. 5, the physical structure and the method of constructing an SRAM cell in accordance with the present invention will be described. Active regions 52, channel region 53 and isolation region 54 are formed on substrate 50. Next, gate oxide 55 and gate electrode 62 (first polysilicon layer) are deposited. Next, isolation layer 57, TFT gate electrodes 58 and TFT gate oxide 56 are deposited. The source/drain layer 60 is then deposited above the gate electrode 58.

The process for constructing a six-transistor SRAM storage cell using N channel depletion mode transistors as load devices in accordance with the present invention will be described.

The active and field isolation layers are formed. Next, the gate oxide layer 55 and gate electrode layer 62 are deposited. The transistor definition for the passgate and pulldown transistors, layer poly crystalline silicon P1 is formed. Next, a layer of TEOS between approximately 1,000 and 2,000 angstroms is deposited. Next, shared contacts 1 (SC1) is patterned and etched. Next, poly crystalline silicon layer P2 is deposited, including the local interconnect and the gate electrode 58 for the N channel TFT. Next, phosphorous is implanted to achieve a desired sheet resistance. Next, the structure is annealed at between approximately 800° C. and 850° C. for approximately 30 minutes.

Next, poly crystalline silicon layer P2 is patterned and etched. Then a layer of TEOS between approximately 200 and 600 angstroms is deposited to form the gate dielectric 52 for the N channel TFT at approximately 800° C. and 850° C. for approximately 30 minutes. Next, layer shared contacts 2 (SC2) is patterned and etched. Poly crystalline silicon layer P3 is deposited and then patterned and etched. Next, the N TFT channel implant is blanketed over the structure with appropriate arsenic or phosphorous doping to achieve a desired drain current. The N+ source/drain layer 60 is patterned, and an appropriate dose of arsenic or phosphorous is implanted into the N+ source/drain layer to achieve the desired drain current. Last, the contact and metal interconnections are made to complete the circuit.

Figure 6:
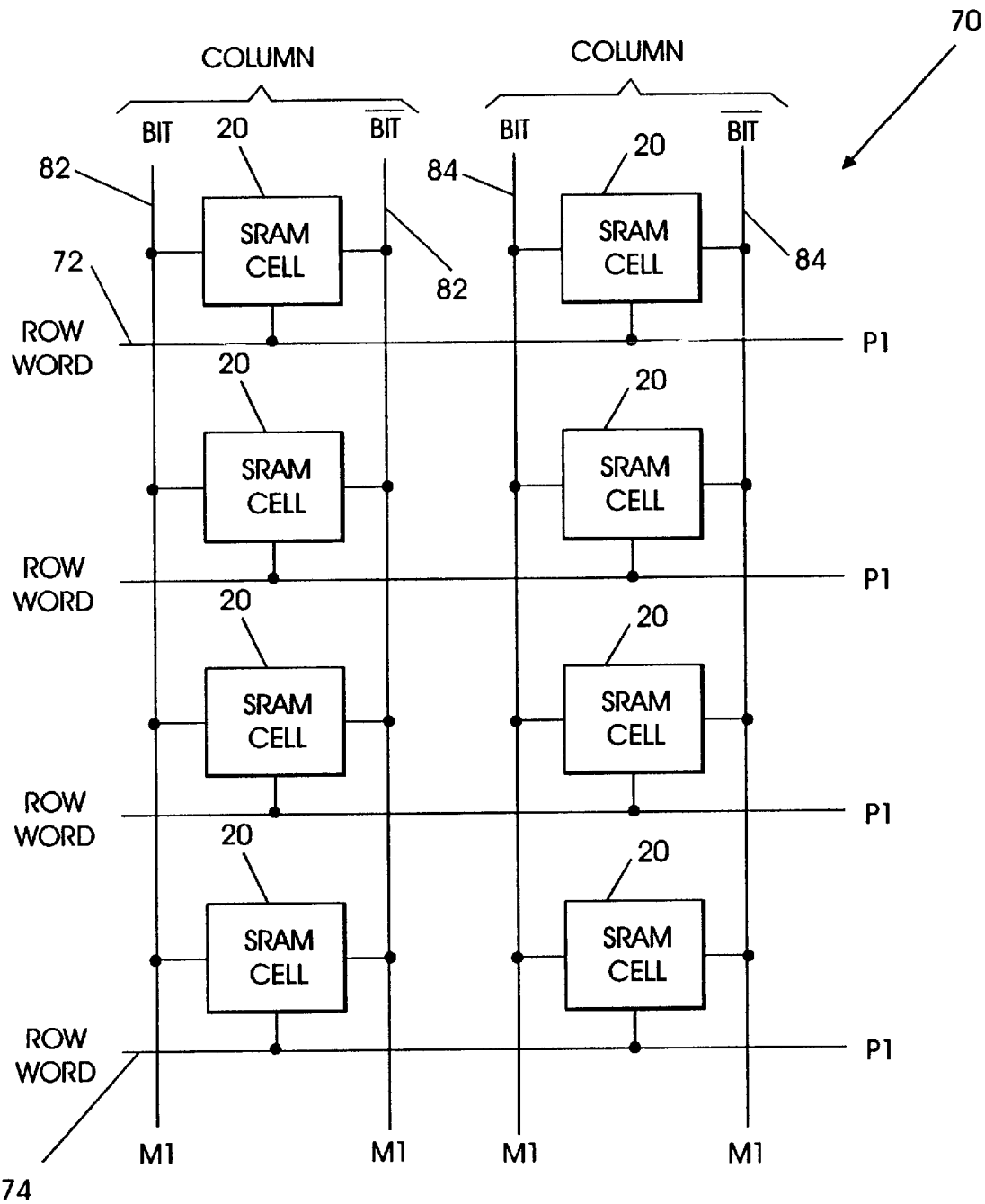
FIG. 6 is a block diagram of an SRAM cell array embodying the present invention.

Referring to FIG. 6, an SRAM cell area embodying the present invention will be described.

Array 70 includes a number of cells 20 (see FIG. 2) arranged in rows and columns. Each cell is connected to a word line 72, . . . 74, and to a pair of bit lines 82, . . . 84.

Although the present invention and its advantages have been described in detail, it should be understood that various changes, substitutions and alterations can be made herein without departing from the spirit or scope of the invention as defined in the appended claims.

What is claimed is:

1. A method of producing a an n-channel bulk pull-down transistor and an n-channel pull-up thin film transistor for an SRAM cell, comprising the steps of:

forming an active and a field isolation region over a semiconductor substrate;

forming a first gate oxide layer and a first polysilicon layer over the semiconductor substrate, the first polysilicon layer defining a gate electrode for the n-channel bulk pull-down transistor;

forming source/drain transistor regions for the n-channel bulk pull-down transistor;

forming an isolation layer over the first polysilicon layer and over the active region;

depositing a second polysilicon layer;

patterning and etching the second poly silicon layer to form a gate electrode for the n-channel pull-up thin film transistor over the n-channel bulk pull-down transistor and electrically connected to a drain region of the n-channel bulk pull-down transistor;

depositing and patterning a dielectric over the second polysilicon layer to form a gate dielectric for the n-channel pull-up thin film transistor;

depositing a third polysilicon layer;

patterning and etching the third polysilicon layer to form channel, source and drain regions of the n-channel pull-up thin film transistor;

implanting dopants into the channel region of the n-channel pull-up thin film transistor so that the n-channel pull-up thin film transistor is a depletion mode transistor;

implanting dopants into the source-drain regions of the n-channel pull-up thin film transistor; and depositing a dielectric layer.

2. The method according to claim 1, wherein a thickness of the isolation layer is between approximately 1000 and 2000 angstroms.

3. The method according to claim 1, wherein a thickness of the gate dielectric of the n-channel pull-up thin film transistor is between approximately 200 and 600 angstroms.

4. The method according to claim 1, further comprising the step of:

annealing between 25 and 35 minutes prior to the step of patterning and etching the second polysilicon layer.

5. The method according to claim 1, further comprising the step of:

annealing at a temperature approximately between 800 and 850 degrees centigrade prior to the step of patterning and etching the second polysilicon layer.

6. A method of forming an inverter circuit for an SRAM cell, comprising the steps of:

forming a first dielectric layer over the at least one active area defined in a semiconductor substrate;

forming a first polysilicon layer over the dielectric layer;

forming source/drain regions in the semiconductor substrate, wherein the first dielectric layer, the first polysilicon layer and the source/drain regions form the gate oxide, the gate electrode and the source/drain regions, respectively, of an n-channel bulk pull-down transistor;

forming a second dielectric layer over the first polysilicon layer;

forming a second polysilicon layer over active area so as to form a gate region for an n-channel thin film pull-up transistor, the second polysilicon layer electrically contacting the drain region of the n-channel bulk pull-down transistor;

forming a third dielectric layer over a portion of the second polysilicon layer to define a gate oxide for the n-channel thin film pull-up transistor;

forming a third polysilicon layer over the dielectric layer and the second polysilicon layer to define source, drain and channel regions of the n-channel thin film pull-up transistor, wherein the source region of the n-channel thin film pull-up transistor is electrically connected to the gate region thereof and the drain region of the n-channel bulk pull-down transistor; and implanting first dopants into the channel region of the n-channel thin film pull-up transistor and second dopants into the source and drain regions of the n-channel thin film pull-up transistor so that the n-channel thin film pull-up transistor forms a depletion mode transistor.

7. The method of claim 6, further comprising the step of:

annealing at approximately between 800° C. and 850° C. for a predetermined period of time following the step of forming a second polysilicon layer.

8. The method of claim 6, further comprising the step of:

annealing at a predetermined temperature for approximately 30 minutes following the step of forming a second polysilicon layer.

9. The method of claim 6, wherein:

the first dopants comprise one of arsenic dopants or phosphorous dopants.

10. The method of claim 6, wherein:

the second dopants comprise one of arsenic dopants or phosphorous dopants.

11. A method of fabricating a circuit for a static random access memory cell, comprising the steps of:

forming a first dielectric layer over the at least one active area defined in a semiconductor substrate;

forming a first polysilicon layer over the dielectric layer;

forming source/drain regions in the semiconductor substrate, wherein the first dielectric layer, the first polysilicon layer and the source/drain regions form the gate oxide, the gate electrode and the source/drain regions, respectively, of a first and a second n-channel bulk pull-down transistor;

forming a second dielectric layer over the first polysilicon layer;

forming a second polysilicon layer over active area so as to form a gate region for a first and a second n-channel thin film pull-up transistor, the gate region of the first n-channel thin film pull-up transistor electrically contacting the drain region of the first n-channel bulk pull-down transistor and the gate region of the second n-channel bulk pull-down transistor, and the gate region of the second n-channel thin film pull-up transistor electrically contacting the drain region of the second n-channel bulk pull-down transistor and the gate region of the first n-channel bulk pull-down transistor;

forming a third dielectric layer over a portion of the second polysilicon layer to define a gate oxide for the first and second n-channel thin film pull-up transistors;

forming a third polysilicon layer over the dielectric layer and the second polysilicon layer to define source, drain and channel regions of the first and second n-channel thin film pull-up transistors, wherein the source region of the first n-channel thin film pull-up transistor is electrically connected to the gate region thereof and the drain region of the first n-channel bulk pull-down transistor, and the source region of the second n-channel thin film pull-up transistor is electrically connected to the gate region thereof and the drain region of the second n-channel bulk pull-down transistor; and implanting first dopants into the channel region of the first and second n-channel thin film pull-up transistors and second dopants into the source and drain regions of the first and second n-channel thin film pull-up transistors so that the first and second n-channel thin film pull-up transistors each forms a depletion mode transistor.

12. The method of claim 11, further comprising the step of:

annealing at approximately between 800° C. and 850° C. for a predetermined period of time following the step of forming a second polysilicon layer.

13. The method of claim 11, further comprising the step of:

annealing at a predetermined temperature for approximately 30 minutes following the step of forming a second polysilicon layer.

14. The method of claim 11, wherein:

the first dopants comprise one of arsenic dopants or phosphorous dopants.

15. The method of claim 11, wherein:

the second dopants comprise one of arsenic dopants or phosphorous dopants.

* * * * *

UNITED STATES PATENT AND TRADEMARK OFFICE
CERTIFICATE OF CORRECTION

PATENT NO.     : 6,251,713 B1                                    Page 1 of 1
DATED          : June 26, 2001
INVENTOR(S)    : Chan et al.

It is certified that error appears in the above-identified patent and that said Letters Patent is hereby corrected as shown below:

Column 1,
Line 37, replace "same" with -- some --

Column 3,
Line 66, replace "wore" with -- more --

Column 4,
Line 42, replace "52" with -- 56 --

Signed and Sealed this

Twenty-sixth Day of February, 2002

Attest:

Attesting Officer

JAMES E. ROGAN
Director of the United States Patent and Trademark Office